(12) United States Patent
Melanson

(10) Patent No.: US 7,391,842 B1
(45) Date of Patent: Jun. 24, 2008

(54) DIRECT SYNTHESIS CLOCK GENERATION CIRCUITS AND METHODS

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 83 days.

(21) Appl. No.: 11/432,113

(22) Filed: May 11, 2006

Related U.S. Application Data

(63) Continuation of application No. 10/010,819, filed on Dec. 6, 2001, now Pat. No. 7,092,476.

(51) Int. Cl.
*H03D 3/24* (2006.01)

(52) U.S. Cl. .................. 375/376; 375/373; 375/327; 341/110; 341/144; 341/147

(58) Field of Classification Search .......... 375/376, 375/373, 327, 294, 215; 341/110, 117, 144, 341/147
See application file for complete search history.

(56) References Cited

U.S. PATENT DOCUMENTS 5,563,535 A * 10/1996 Corry et al. ............ 327/105
6,150,969 A * 11/2000 Melanson ............... 341/143

FOREIGN PATENT DOCUMENTS

GB    WO 31881    *  6/2000

* cited by examiner

*Primary Examiner*—Ted Wang
(74) *Attorney, Agent, or Firm*—James J. Murphy; Thompson & Knight LLP

(57) ABSTRACT

Clock signal generation circuitry includes input circuitry for receiving a frequency control input signal and a clock signal and generating a memory address therefrom, a memory for storing digital data indexed by the memory address and representing real and imaginary parts of a complex digital waveform, and digital to analog conversion circuitry. The digital to analog conversion circuitry includes real-part digital to analog conversion circuitry for converting digital data retrieved from the memory and representing the real part of the complex waveform into a real-part analog signal and imaginary-part digital to analog conversion circuitry for converting digital data retrieved from the memory and representing the imaginary part of the complex waveform into an imaginary-part analog signal. The clock signal generation circuitry also includes analog filtering circuitry having real-part filtering circuitry for filtering the real-part analog signal to generate a filtered real-part analog signal and imaginary-part filtering circuitry for filtering the imaginary-part analog signal to generate a filtered imaginary-part analog signal. Analog to digital conversion circuitry is provided for converting the filtered real-part and imaginary-part analog signals into a digital clock signal at a rate near an integer multiple of a frequency of the filtered real-part and imaginary-part analog signals.

27 Claims, 7 Drawing Sheets

DIRECT SYNTHESIS CLOCK GENERATION CIRCUITS AND METHODS

CROSS REFERENCE TO RELATED APPLICATIONS

This application for patent is a continuation of U.S. patent application Ser. No. 10/010,819, filed Dec. 6, 2001 now U.S. Pat. No. 7,092,476.

BACKGROUND OF INVENTION

Field of Invention

Often high functionality digital processing devices include multiple processing engines operating in response to clock signals of different frequencies. In other words, the speed of the clocks mediating the operation of various circuit blocks and other on-chip operational units may differ, depending on the function being implemented. These various clocks typically should be synchronous, especially when correlated data, such as audio and video, are being processed.

Traditional PLL techniques allow for the generation of multiple clock frequencies with relatively simple relationships. However, these frequencies are often insufficient to support disparate processing operations. For example, while processing an audio—video data stream, the video is typically processed at a clock frequency substantially higher than that used to process the audio. Moreover, the audio and video clocks may or may not be rationally related. In other words, it may not be possible to easily generate accurate synchronous audio and video clocks by simply dividing-down or multiplying-up a master clock in a PLL or similar circuit.

Additionally, the issue of clock jitter must be addressed. On the one hand, the loop filter cut-off in a conventional PLL should be sufficiently low to reduce reference feedthrough. However, on the other hand, reducing the cut-off frequency of the loop filter increases the VCO noise that falls outside the control of the loop. In other words, some trade-off must normally be made between clock jitter caused by reference clock feedthrough and that caused by VCO noise.

In sum, new techniques are required for generating low-jitter clocks, including clocks of widely varying frequencies and/or frequency varying by non-rational factors.

SUMMARY OF INVENTION

According to one embodiment of the inventive principles, a clock generator is disclosed which includes input circuitry for receiving an input signal and generating a memory address therefrom. A memory stores digital data indexed by the memory address which represents at least a portion of an analog clock. A digital to analog converter converts data retrieved from the memory to generate the analog clock which is then filtered by an associated filter to reduce jitter. The analog clock is then converted to a digital output clock.

Clock generation circuits and methods embodying the present inventive principles offer substantial advantages over the prior art. Among other things, the final output clock has substantially reduced jitter. Additionally, the problem of reference clock feedthrough is also substantially reduced or eliminated. Moreover, the various clock generation circuits disclosed can be integrated into a chip or other device relatively easily and inexpensively.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-8 of the drawings, in which like numbers designate like parts.

Figure 1:
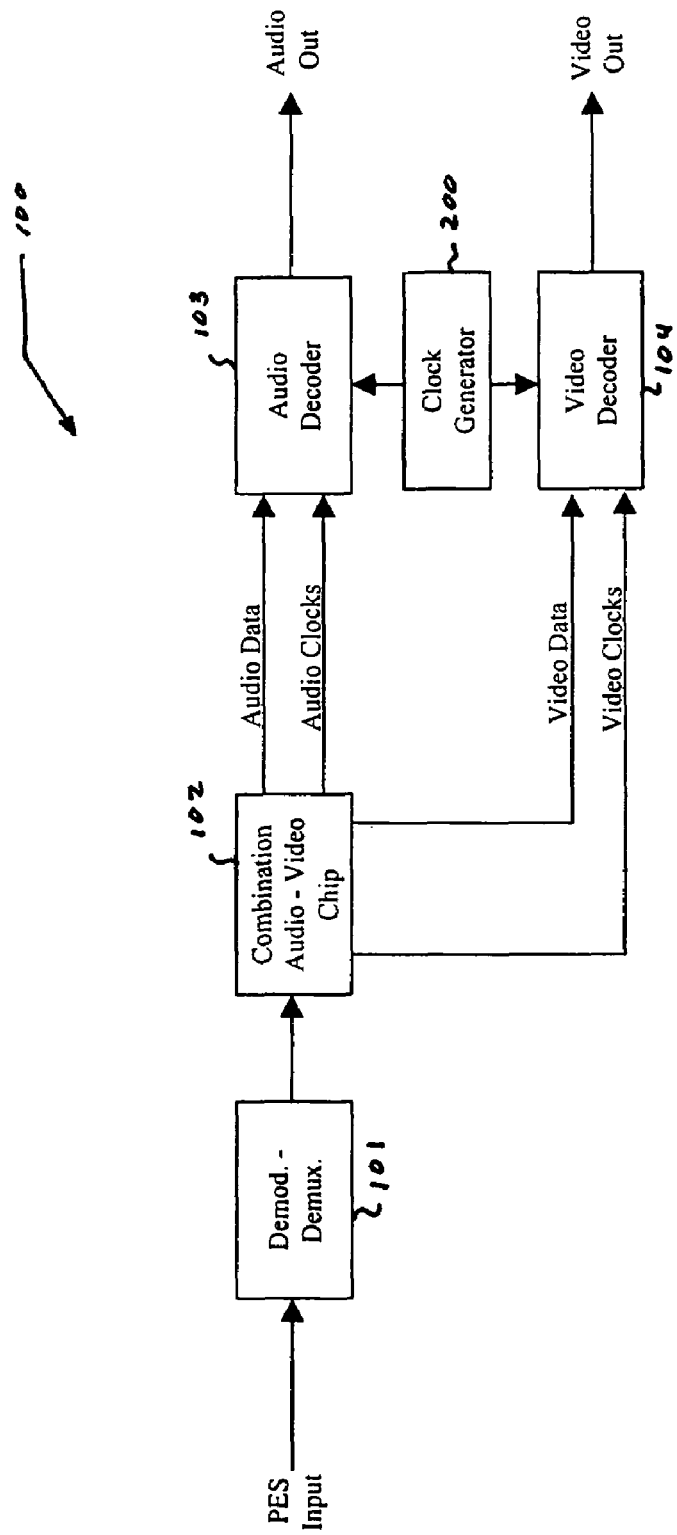
FIG. 1 is a high level functional block diagram of an exemplary audio-video system suitable to describing the present principles.

An exemplary broadcast system 100 suitable for demonstrating the application of the present inventive principles is shown in FIG. 1. In this case data are received from a transmission device, such as a wireless or cable broadcast station in the form of a transport stream, such as an MPEG2 transport stream. The transport stream is a multiplex of audio, video, system control and programming information. The audio and video data, for example, could be multiplexed into the transport stream as Packetized Elementary Streams (PES).

At the receiver, the data are extracted from the given carrier signal by a demodulator-demultiplexer 101. Audio-Video Combination 102 chip splits out the compressed audio and video PES streams which are respectively sent to the audio and video decoders 103 and 104.

Audio and video decoders 103 and 104 preferrably operate in response to one or more clock generators 200 discussed in detail below. Advantageously, clock generators 200 provide low-jitter clocks with minimal reference feedthrough across the wide range of clock frequencies needed for both the audio and video processing operations.

Figure 2:
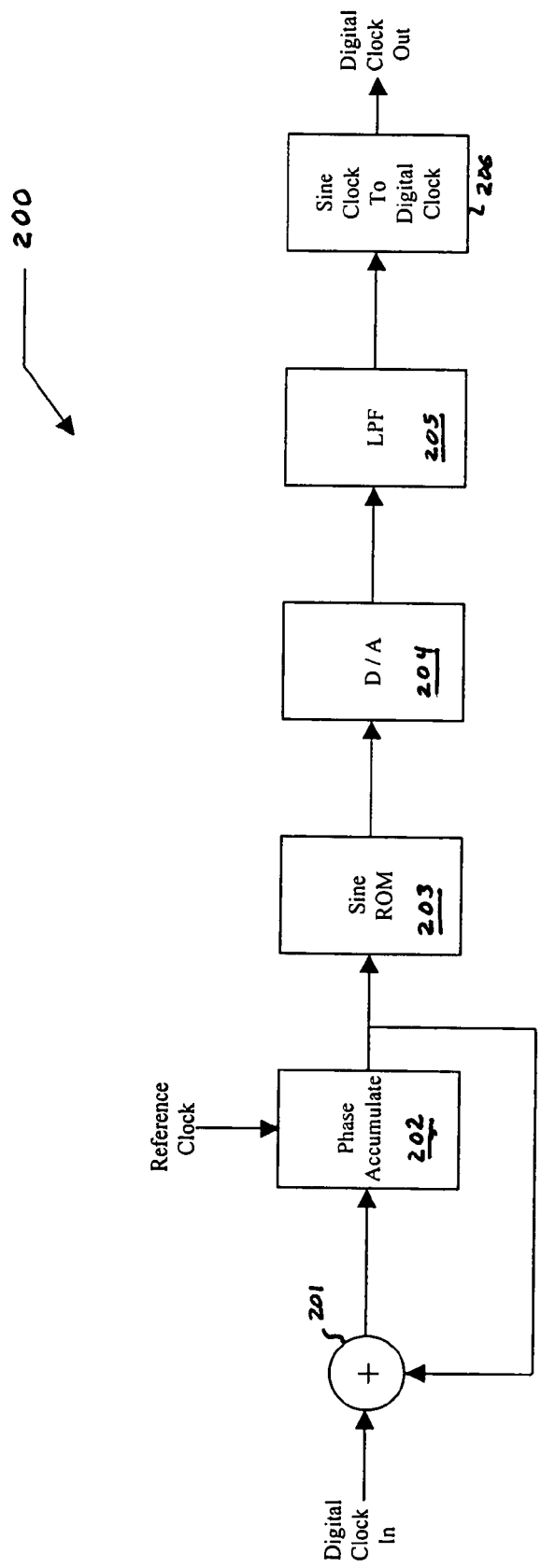
FIG. 2 is a high level block diagram of a first clock generator embodying the principles of the present invention.

FIG. 2 is a high level functional block diagram of a selected clock generator 200 according to one embodiment of the present principles. The input digital frequency is summed in summer (digital adder) 201 with the output of a digital phase accumulator 202. Phase accumulator 202 generates an index to Sine ROM 203 from the current phase at the reference clock rate. In other words, the input clock frequency is summed with feedback from the output of a j-bit wide phase accumulator which steps by a corresponding phase angle step in response to the reference clock from an initial value to a maximum value of $2^j$ and then wraps around to the initial value to generate a modulo-$2^j$) output at a frequency:

$$f_{out} = f_{ref} * f_{in} / 2^j$$

Figure 3:
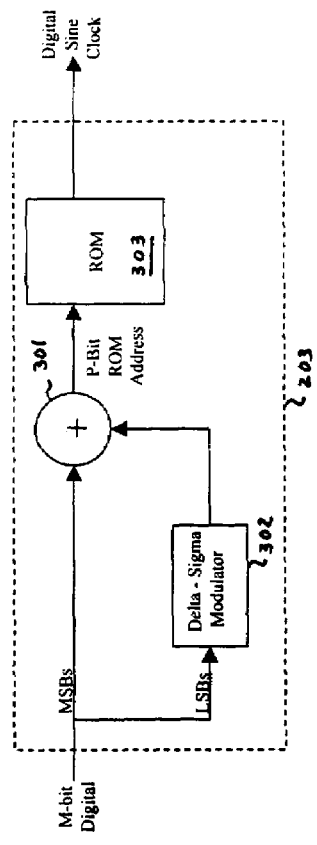
FIG. 3 is a more detailed functional block diagram of the read-only memory shown in FIG. 2 and related indexing circuitry.

Sine (or cosine) ROM 203 stores a set of digital values approximating an analog sinewave clock signal; one particular embodiment is shown in FIG. 3. In the FIG. 3 embodiment, the MSBs of the m-bit wide output from the phase detector are summed in a digital adder 301 with associated LSBs after noise shaping. The noise shaping function can be implemented, for example with a delta-sigma noise shaper (modulator) 302 which translates the noise to a higher out-of-band frequency and, through requantization, reduces the number of bits required to address ROM 303 (and consequently the ROM size itself). If the input for example is 16-bits, the index to Sine (cosine) ROM 303 could be partitioned into 8 MSBs and 8 LSBs, with an 8-bit noise-shaper 302 and an 8-bit adder 301 used to generate 8-bit ROM addresses. The stored sinewave data may also be folded to reduce the amount of memory capacity required.

The digital sine (cosine) clock from the ROM is then passed through a digital to analog (D/A) converter 204 and the resulting analog signal low pass or bandpass filtered by filter 205. The filtering on the sine clock is targeted to reduce the jitter in the ultimate output clock by passing the sine wave and blocking noise. There are a number of ways to implement the D/A conversion and low pass filtering; examples of preferred techniques are discussed below.

The output digital clock at the new clock frequency is then generated in circuit block 206 from the analog sinewave. This can be done with a simple comparator or with a phase-locked loop or similar circuit.

Clock generator 200 has substantial advantages. Among other things, it is relatively simple to integrate in an integrated circuit or system and eliminates or substantially reduces the problem of reference feed through. Additionally, clock generator 200 has a "fast lock" where the reset of the final digital frequency is almost instantaneous. Consequently, filter 205 and the backend circuitry of block 206 can be very fast.

Consider for example an input signal (clock) of 1.5 MHz and a nominal reference clock of 24 MHz driving a final output PLL. Assuming that sine clock periods corresponding to frequencies in the range of 1.5 to 3 MHz are stored in ROM and that a final PLL multiplier of 8 is used, then a final output in the range of 12-24 MHz can be generated relatively easily.

Figure 4:
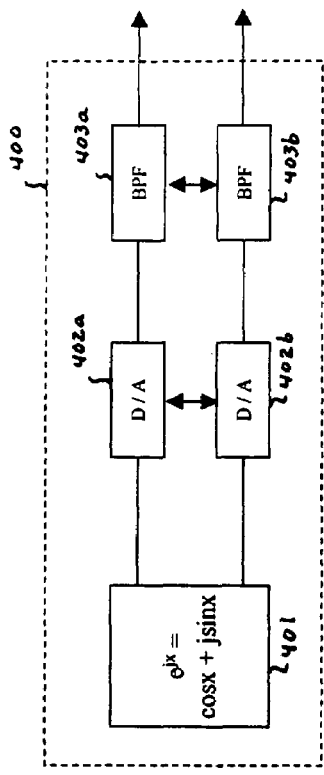
FIG. 4 shows an alternate to the ROM, digital to analog converter and filter configuration shown in FIG. 2 in which complex waveforms are used to generate the final output clock signal.

In an alternate embodiment, sine or cosine ROM 203, D/A converter 205 and low pass filter 206 are replaced with the complex-domain circuit block 400 shown in FIG. 4. In this case, digital data representing points along one or more periods of a complex exponential waveform, are stored in a sine and cosine ROM 401 as real ($\cos(x)$) and imaginary ($\sin(x)$) parts. The data may also be "folded" such that only data from a portion of the sinewave is stored and then used to reconstruct the full period of the sinewave. The addressed data are then converted to analog form and low pass or bandpass filtered by cross-coupled D/A converters 402$a,b$ and cross-coupled bandpass filters 403$a,b$. The real and imaginary parts allow for the generation of in-phase (I) and quadrature (Q) clocks, which can be used to double or quadruple the output clock frequency.

As indicated briefly above, there are a number of different ways that the D/A conversion stages 204 and 402 can be implemented. For example, assuming an embodiment operating on a complex digital signal having real and imaginary parts, a pair of traditional bandpass delta-sigma modulators could be used. However, this approach adds complexity to the circuit, especially if tuning is required.

Figure 5:
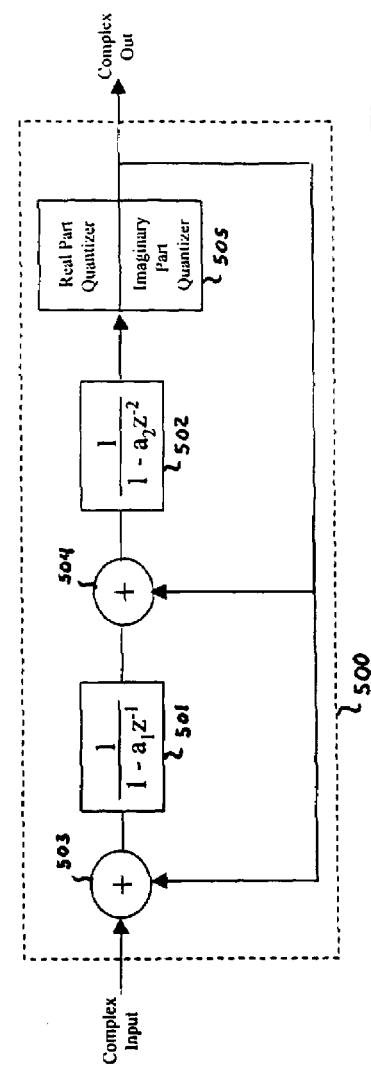
FIG. 5 is a functional block diagram of a second order delta-sigma modulator suitable for use in the digital to analog converters of FIG. 4.

A second approach is illustrated in FIG. 5. In this case, a second order complex delta-sigma modulator 500 includes first and second complex filter stages 501 and 502. The complex modulator quantizer 505 correspondingly includes circuits for quantizing the real and imaginary parts of the signal output from integrator stages 502. Summers 503 and 504 support feedback to the filter stages with complex feedback coefficients a1 and a2, as selected to set the zero of the transfer function of the delta-sigma modulator. These coefficients allow the modulator zeros to be arbitrarily set along the unit circle at the desired sine frequency. The resulting output spectrum then has zeroes at the sine frequency A third, and preferred D/A conversion technique is through tunable complex quantizer 600 shown in FIG. 6. Here, the real and imaginary parts output from complex ROM 401 are low pass filtered by low pass filters 601$a,b$ respectively. Filters 601$a,b$ can be of a simple design, such as those based on a second order delta-sigma modulator.

The filtered versions of the real and imaginary data are then rotated by complex rotator 602 by a phase angle factor. Rotator 603 is preferably a complex multiplier which allows the noise shaping function of the D/A conversion to track the center frequency of the clock being generated. Rotator 602 could be, for example, based on a look-up table in ROM storing real and imaginary rotated parts. For example, the 3 MSBs of each of the real and imaginary parts could be concatenated with a 6-bit phase angle to produce addresses to the ROM. Rotator 602, as well as rotator 603, can also be constructed from a combination of ROM, adders and multiplexers.

The real and imaginary output from the first rotator (602) are then highly quantized by quantizers 603. For example, the quantizer outputs could be quantized in 1 to 3 bits. Advantageously, this coarse quantization allows the rotator look-up table to be relatively simple. For the case of a complex signal, the quantizer outputs are then bandpass filtered, as discussed further below.

A second complex rotator 604 is provided in the feedback loop to bring the output signal back into phase with the input. Rotator 604 correspondingly outputs data at the full accuracy of the input signals, although the input to rotator is coarsely quantized. The phase angle factors applied by rotators 602 and 604 correspond to complex conjugates under control of circuit block 605.

Backend BPFs 403 reduce noise from the synthesized analog sine and cosine signals to control jitter in the final output clock. In the preferred embodiment, at least the final stages of these filters are continuous time filters. Using continuous time filters constructed from tunable transconductances and capacitors is one approach. These filters can be based on one or more cascaded resonators such as resonator 700 shown in FIG. 7A. Resonator 700 includes cross-coupled real and imaginary paths based on tunable transconductances 701-703, capacitors 804 and amplifiers 804. In this example, if the center frequency being generated is f, then:

$$2\pi f = g_{m3}/C \text{then} \tag{1}$$

$$g_{m1} = g_{m2} = g_{m3}/Q_1 \tag{2}$$

where a resonator Q of 5-20 will be sufficient for filters using 1-3 resonator stages 800.

Figure 7A:
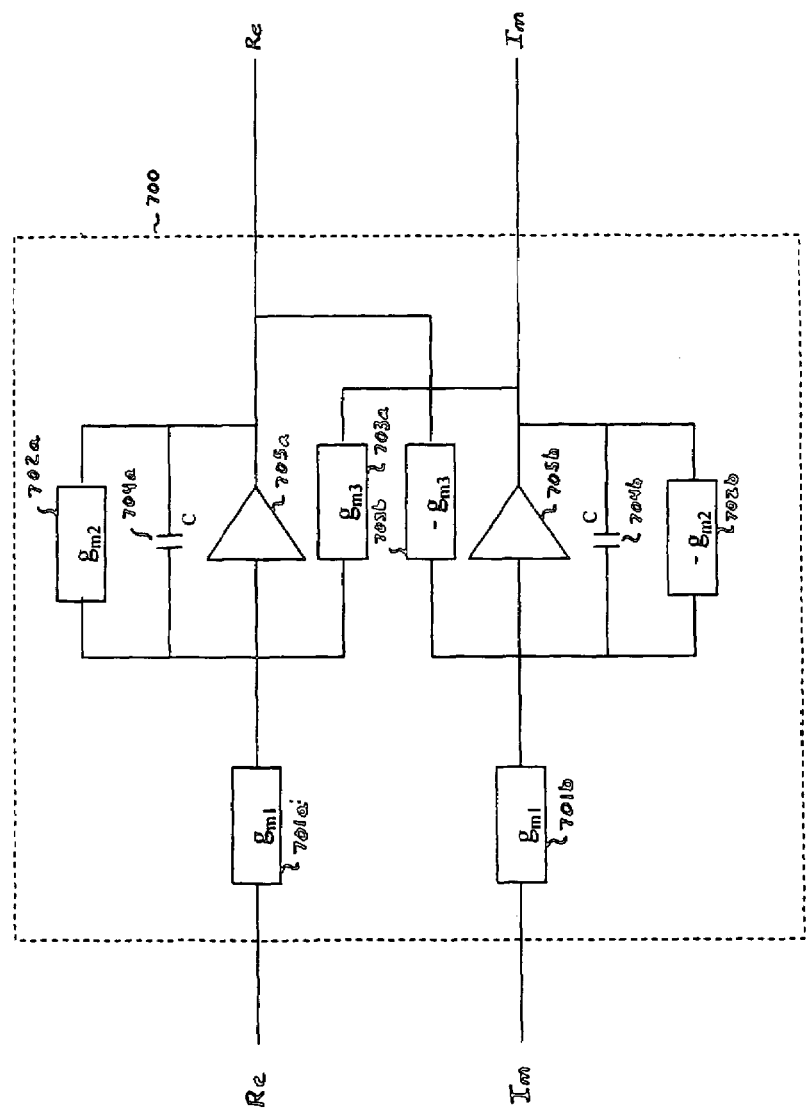
FIG. 7A is a functional block diagram of a resonator circuit suitable for use in constructing continuous time filters for stages in the bandpass filters shown in FIG. 4.
Figure 7B:
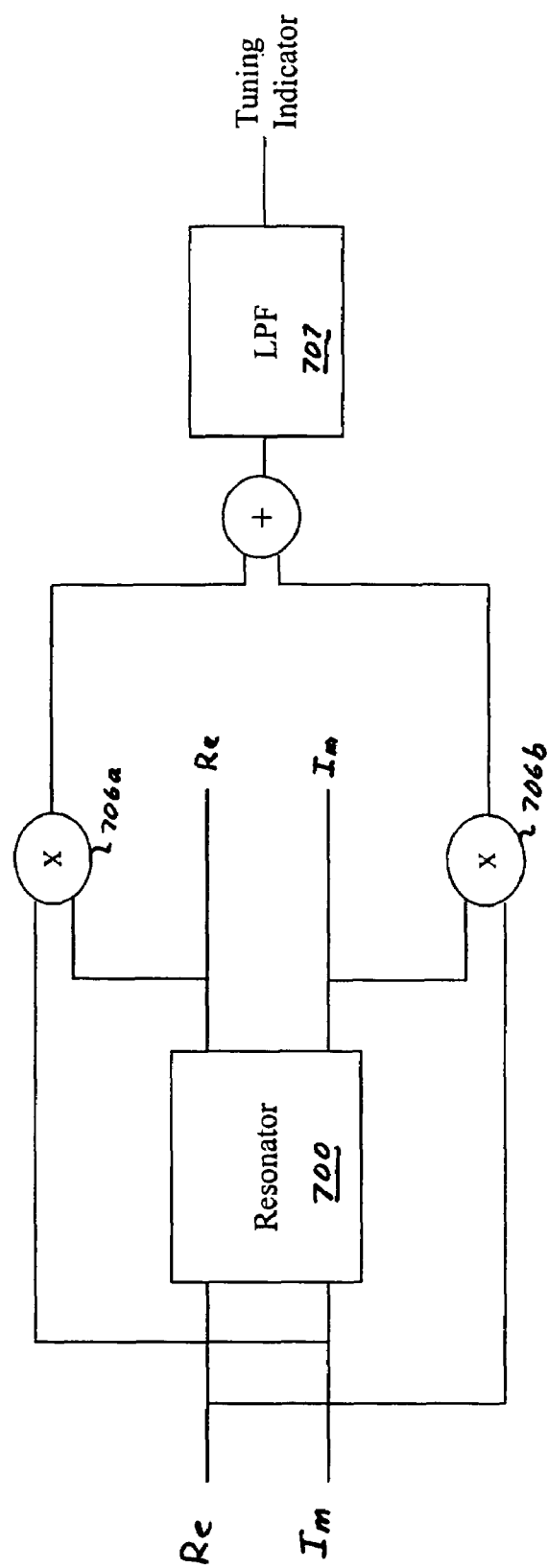
FIG. 7B is a functional block diagram of one possible technique for tuning the resonator shown in FIG. 7A.

FIG. 7B illustrates one technique for tuning the tunable conductances of resonator 700. Here, the output of cross-coupled multipliers 706$a,b$ will only have a DC component when resonator 700 is out of tune. A low pass filter 707 is then used to extract this DC component to generate a tuning indicator signal for adjusting one or more of the tunable transconductances of the resonator.

Figure 8:
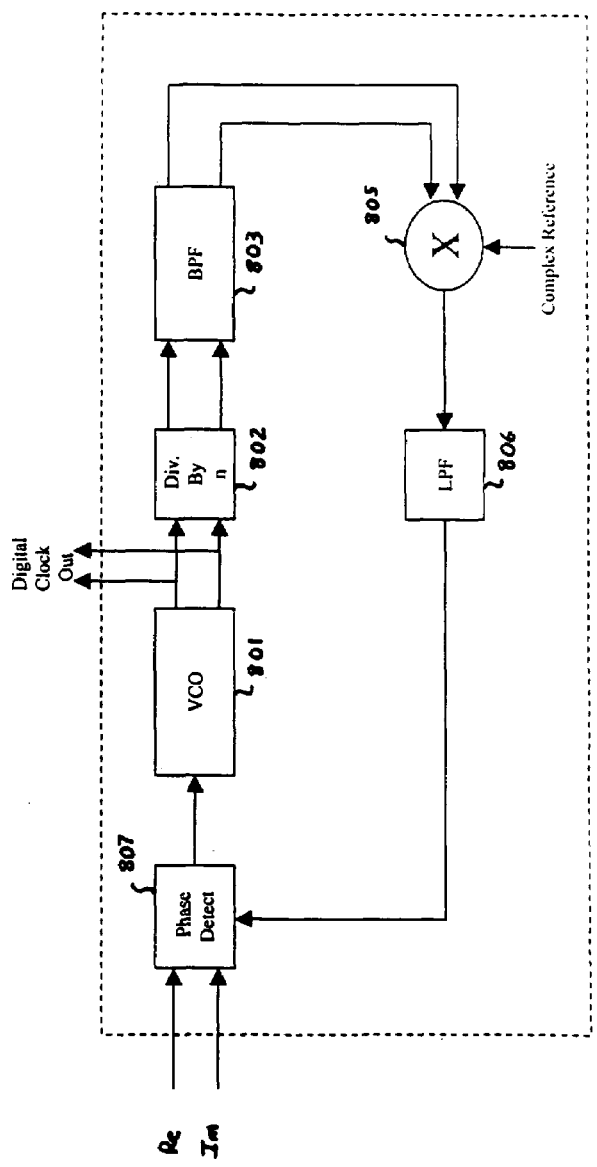
FIG. 8 is a functional block diagram of one possible phase-locked loop for generating the final output clock from the output of the generator circuitry of FIG. 4.
Figure 6:
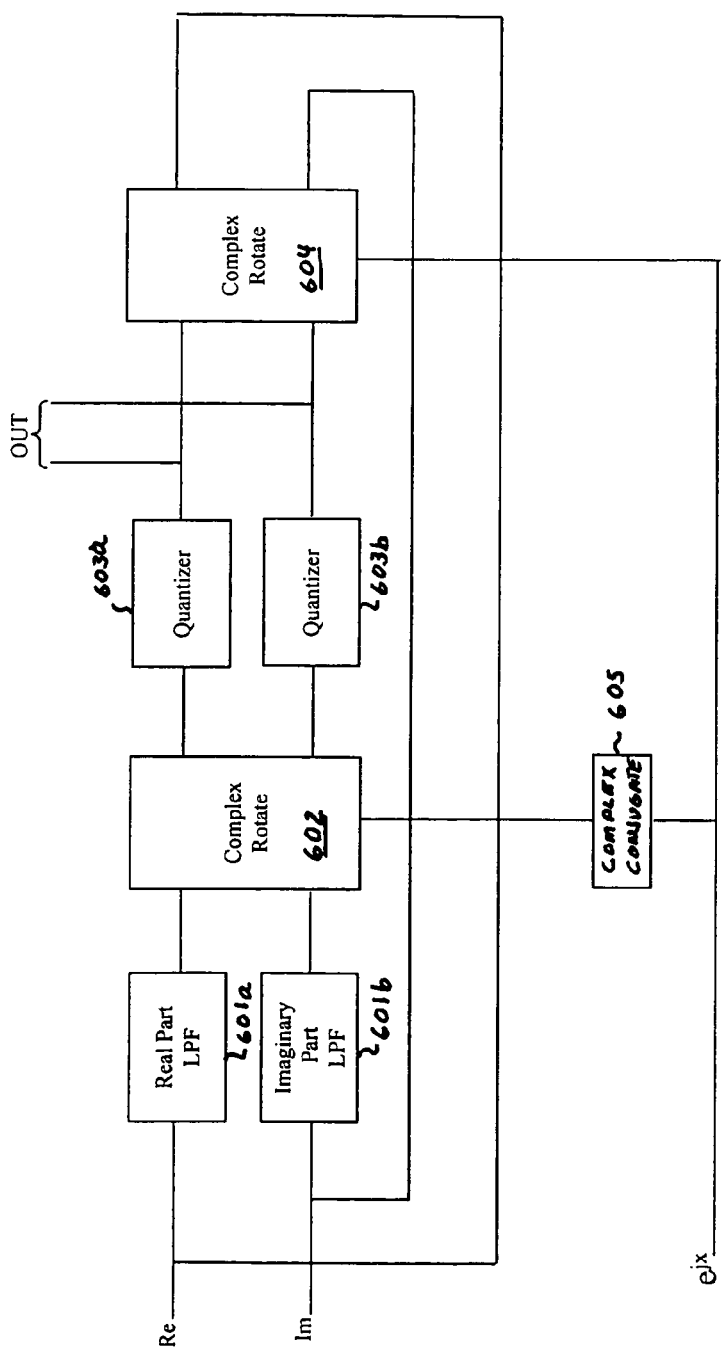
FIG. 6 is a functional block diagram of a tuned quantizer digital to analog converter suitable for use in the embodiment of FIG. 4.

FIG. 8 shows one possible embodiment of a back-end phase-locked loop 800 suitable for generating the final digital clock in block 206 from the filtered analog signal. Here, the output from voltage controlled oscillator (VCO) 801 is divided in block 802 by a divisor n (e.g. 4, 8, 10, and so on) to generate a "gray code" of two out 90-degree out of phase digital clocks forming a complex clock signal. The complex clock signal is optionally filtered by bandpass filter (BPF) 803 and then convolved by a complex reference signal by multiplier 805 and filtered by low pass filter 806. The result is a low frequency that is fedback to front-end phase (frequency) detector 805 at the voltage control input to VCO 801, where it is compared against the real and imaginary parts of the synthesized analog clock waveform. The final output digital clock has only a small amount of additional noise from the convolution. More importantly, there is little, if any, reference feedthrough.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A clock signal generator comprising:
   input circuitry for receiving a frequency control input signal and a clock signal and generating a memory address therefrom;
   a memory for storing digital data indexed by said memory address and representing real and imaginary parts of a complex digital waveform;
   digital to analog conversion circuitry comprising:
      real-part digital to analog conversion circuitry for converting digital data retrieved from the memory and representing the real part of the complex waveform into a real-part analog signal; and
      imaginary-part digital to analog conversion circuitry for converting digital data retrieved from the memory and representing the imaginary part of the complex waveform into an imaginary-part analog signal;
   an analog filtering circuitry comprising:
      real-part filtering circuitry for filtering the real-part analog signal to generate a filtered real-part analog signal; and
      imaginary-part filtering circuitry for filtering the imaginary-part analog signal to generate a filtered imaginary-part analog signal; and
   analog to digital conversion circuitry for converting the filtered real-part and imaginary-part analog signals into a digital clock signal at a rate near an integer multiple of a frequency of the filtered real-part and imaginary-part analog signals.

2. The clock signal generator of claim 1, wherein the frequency of the digital clock signal is substantially equal to a frequency of the frequency control input signal.

3. The clock signal generator of claim 1, wherein the frequency control input signal is generated by an associated digital phase lock loop including a phase comparator responsive to an input locking clock signal.

4. The clock signal generator of claim 1, wherein the digital to analog conversion circuitry comprises first and second cross-coupled digital to analog converters for respectively converting the real and imaginary parts of the complex waveform into the real-part and imaginary-part analog signals.

5. The clock signal generator of claim 1, wherein the analog filtering circuitry comprises first and second cross-coupled analog filters for respectively filtering the real-part and imaginary-part analog signals.

6. The clock signal generator of claim 1, wherein the digital to analog conversion circuitry comprises a complex delta-sigma converter including:
   a complex loop filter for filtering the real and the imaginary parts of the complex digital waveform;
   a real-part quantizer for quantizing a filtered real-part signal output from the complex loop filter; and
   an imaginary-part quantizer for quantizing a filtered imaginary-part signal output from the complex loop filter.

7. The clock signal generator of claim 1, wherein the analog to digital conversion circuitry comprises:
   a real-part data path including a real-part filter for filtering the real part of the complex digital waveform, real-part rotator circuitry for applying a rotating factor to an output of the real-part filter, and a real-part quantizer for quantizing a resulting filtered and rotated real-part data stream; and
   an imaginary-part data path including an imaginary-part filter for filtering the imaginary-part of the complex digital waveform, imaginary-part rotator circuitry for applying a rotating factor to an output of the imaginary-part filter, and an imaginary-part quantizer for quantizing a resulting filtered and rotated imaginary-part data stream.

8. The clock signal generator of claim 7, further comprising:
   a real-part feedback path coupling an input of the real-part filter and the real-part quantizer and including a rotator for applying a rotating factor to the filtered and rotated real-part data stream; and
   an imaginary-part feedback path coupling an input of the imaginary-part filter and the imaginary-part quantizer and including another rotator for applying another rotating factor to the filtered and rotated imaginary-part data stream.

9. The clock signal generator of claim 1, wherein the analog filtering comprises at least one bandpass filter including a cascade of resonators.

10. The clock signal generator of claim 9, wherein the bandpass filter comprises first and second cross-coupled integrators filtering the real-part and imaginary-part analog signals.

11. The clock signal generator of claim 10, wherein resonators forming the cascade of resonators comprise tunable transconductances.

12. The clock signal generator of claim 9, wherein resonators forming the cascade of resonators comprise tunable transconductances.

13. The clock signal generator of claim 1, wherein the input circuitry comprises:
- a phase accumulator stepping in response to a reference clock signal and outputting the memory address;
- a summer for summing the input signal with memory addresses fed-back from the phase accumulator to generate a control input signal for input into the phase accumulator.

14. The clock signal generator of claim 1, further comprising a noise shaper for noise shaping at least some bits of the memory address.

15. The clock signal generator of claim 1, wherein the analog to digital conversion circuitry comprises a complex phase locked loop including:
- a phase detector having signal inputs for respectively receiving the real-part and imaginary-part analog signals and a feedback signal input;
- a voltage controlled oscillator including a control input for receiving a control signal from the phase detector and an output providing the digital clock signal; and
- a feedback loop including a divider responsive to an output of the voltage controlled oscillator and providing the feedback signal to the phase detector.

16. The clock signal generator of claim 15, wherein the voltage controlled oscillator comprises a complex voltage controlled oscillator outputting a complex digital clock signal including a real-part digital clock signal and an imaginary-part digital clock signal.

17. The clock signal generator of claim 1, wherein the digital clock signal comprises a complex digital clock signal including a real-part digital clock signal and an imaginary-part digital clock signal.

18. The clock signal generator of claim 15, wherein the feedback loop comprises a complex feedback loop operating on first and second feedback signals which are approximately ninety degrees out-of-phase.

19. The clock signal generator of claim 15, wherein the phase detector comprises a complex multiplier.

20. A signal generator comprising:
- synthesis circuitry for generating a complex digital waveform including real-part and imaginary-part digital signals in response to an input signal;
- conversion circuitry for converting the real-part and imaginary-part digital signals into real-part and imaginary-part analog signals; and
- a complex phase-locked loop for converting the real-part and Imaginary-part analog signals into a complex digital output signal including real-part and imaginary-part digital output signals having frequencies of a selected multiple of a frequency of the real-part and Imaginary-part analog signals a complex digital to analog converter comprising a complex delta-sigma modulator including a complex loop filter for filtering the real-part and imaginary part digital signals, a real-part quantizer for quantizing a filtered real-part digital signal output from the complex loop filter, and an imaginary-part quantizer for quantizing a filtered imaginary-part digital signal output from the complex loop filter.

21. The signal generator of claim 20, wherein the complex phase-locked loop comprises:
- a complex phase detector for detecting a phase relationship between the real-part and imaginary-part analog signals and a feedback signal and in response generate a frequency control signal;
- a voltage controlled oscillator for generating the complex digital output signal including real and imaginary parts each having a frequency controlled by the frequency control signal; and
- a feedback loop for generating a reference signal from the complex digital output signal.

22. The signal generator of claim 21, wherein the feedback loop comprises:
complex multiplier and a filter for filtering an output signal generated by the complex multiplier circuitry to generate the feedback signal.

23. The signal generator of claim 21, further comprising:
divider circuitry for dividing the frequency of the real and imaginary parts of the complex digital output signal to generate frequency-divided real and imaginary parts of the complex digital output signal; and
filtering circuitry for filtering the frequency-divided real and imaginary parts of the complex digital output signal by the selected multiple and providing filtered frequency-divided real and imaginary parts of the complex digital output signal to convolution circuitry.

24. A signal generator comprising:
synthesis circuitry for generating a complex digital waveform including real-part and imaginary-part digital signals in response to an input signal; and
a complex digital to analog converter operating on the real-part and imaginary-part digital signals and generating in response real-part and imaginary-part analog signals, the complex digital to analog converter comprising a complex delta-sigma modulator including a complex loop filter for filtering the real-part and imaginary part digital signals, a real-part quantizer for quantizing a filtered real-part digital signal output from the complex loop filter, and an imaginary-part quantizer for quantizing a filtered imaginary-part digital signal output from the complex loop filter.

25. The signal generator of claim 24, wherein the complex digital to analog converter comprises first and second cross-coupled digital to analog converters respectively operating on the real-part and imaginary-part digital signals.

26. The signal generator of claim 24, wherein the complex delta-sigma modulator implements a band-reject noise transfer function.

27. The signal generator of 24, wherein the complex delta-sigma modulator has a feedback topology utilizing complex feedback coefficients.

* * * * *